US008786362B1

(12) United States Patent
Lin et al.

(10) Patent No.: US 8,786,362 B1
(45) Date of Patent: Jul. 22, 2014

(54) SCHOTTKY DIODE HAVING CURRENT LEAKAGE PROTECTION STRUCTURE AND CURRENT LEAKAGE PROTECTING METHOD OF THE SAME

(71) Applicant: United Microelectronics Corporation, Hsinchu (TW)

(72) Inventors: An-Hung Lin, New Taipei (TW); Wei-Shan Liao, Yunlin County (TW); Bo-Jui Huang, Hsinchu (TW); Hong-Ze Lin, Hsinchu (TW); Ting-Zhou Yan, Hsinchu County (TW); Wen-Chun Chang, Kaohsiung (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/909,097

(22) Filed: Jun. 4, 2013

(51) Int. Cl.
H01L 25/00 (2006.01)
H01L 29/06 (2006.01)
H01L 29/872 (2006.01)

(52) U.S. Cl.
CPC .......... *H01L 29/0642* (2013.01); *H01L 29/872* (2013.01)
USPC .......................................... 327/564; 327/565

(58) Field of Classification Search
USPC .................. 327/564, 565, 582, 583
See application file for complete search history.

(56) References Cited

U.S. PATENT DOCUMENTS

| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |

(Continued)

OTHER PUBLICATIONS

Kunsik Sung and Taeyoung Won, High-side N-channel LDMOS for a High Breakdown Voltage, Journal of the Korean Physical Society, vol. 58, No. 5, May 2011, pp. 1411 1416, Korea.

*Primary Examiner* — Hai L Nguyen
(74) *Attorney, Agent, or Firm* — Ding Yu Tan

(57) ABSTRACT

A Schottky diode having a current leakage protection structure includes a Schottky diode unit, a first isolation portion and a second isolation portion. The Schottky diode unit is defined in a substrate and includes a metalized anode, an active region having dopants of first conductive type, a cathode and at least one isolation structure. The first isolation portion having dopants of second conductive type is formed between substrate and active region, and the first isolation portion includes a first well disposed beneath active region, and a first guard ring surrounding active region and connecting to the first well. The second isolation portion having dopants of first conductive type is formed between substrate and the first isolation portion, and the second isolation portion includes a second well disposed beneath the first well, and a second guard ring surrounding the first guard ring and connecting to the second well.

15 Claims, 2 Drawing Sheets

(56) References Cited

U.S. PATENT DOCUMENTS

| | | |
|---|---|---|
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,859,093 B1 * | 2/2005 | Beigel .................. 327/586 |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 8,362,829 B2 * | 1/2013 | Uemura .................. 327/564 |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0117122 A1 | 5/2010 | Benoit |
| 2010/0148250 A1 | 6/2010 | Lin |
| 2010/0213517 A1 | 8/2010 | Sonsky |
| 2011/0057263 A1 | 3/2011 | Tang |

* cited by examiner

SCHOTTKY DIODE HAVING CURRENT LEAKAGE PROTECTION STRUCTURE AND CURRENT LEAKAGE PROTECTING METHOD OF THE SAME

FIELD OF THE INVENTION

The present invention relates to a Schottky diode, and more particularly to a Schottky diode having a current leakage protection structure. The present invention also relates to a current leakage protecting method of a Schottky diode.

BACKGROUND OF THE INVENTION

With the trend of electronic products getting thinner and being multi-functional, the integration density and the operation speed of semiconductor devices used in a functional circuit of an electronic product are becoming higher. On the other hand, the performance of a shrunken down semiconductor device used in the functional circuit is subject to being negatively affected by current leakage or signal noise. One of the examples of such semiconductor device is a Schottky diode which is commonly used in a functional circuit of a switching-mode power supply. The Schottky diode is a semiconductor device configured with a metal-semiconductor junction, which has a switching speed faster than a switching speed of a conventional p-n rectifier diode. Therefore, the use of the Schottky diode in a functional circuit facilitates higher operation speed of the functional circuit, and thus the integration density of the semiconductor devices included in the functional circuit can thereby be enhanced. However, the Schottky diode has disadvantages including of having a relatively low reverse bias voltage and a relatively high reverse leakage current. In addition, as the reverse leakage current dramatically increases with the raise of temperature, the Schottky diode is likely burned out at elevated temperature. The above problems limit the application of the Schottky diode to a variety of functional circuits.

SUMMARY OF THE INVENTION

Therefore, an object of the present invention is to obviate the above-mentioned drawbacks by protecting the Schottky diode from current leakage so as to improve the integration density of semiconductor devices and the operation speed of the functional circuit.

In accordance with an aspect, the present invention provides a Schottky diode having a current leakage protection structure. The schottky diode unit is defined in a substrate and includes a metalized anode, an active region having dopants of a first conductive type, a cathode and at least one isolation structure, wherein the metalized anode is formed on the active region, and the cathode is formed atop the active region. A first isolation portion having dopants of a second conductive type is formed between the substrate and the active region, and the first isolation portion includes a first well disposed beneath the active region and a first guard ring surrounding the active region and connecting to the first well. A second isolation portion having dopants of a first conductive type is formed between the substrate and the first isolation portion, and the second isolation portion includes a second well disposed beneath the first well and a second guard ring surrounding the first guard ring and connecting to the second well.

In accordance with another aspect, the present invention provides a current leakage protecting method of the Schottky diode having the current leakage protection structure according to an embodiment of the present invention, wherein a first contact region is formed atop the first guard ring, and a second contact region is formed atop the second guard ring. The current leakage protecting method includes steps as follows. Firstly, the metalized anode is coupled to a first voltage, and the cathode is coupled to a second voltage, wherein the first voltage is set to be equal to or higher than the second voltage. The first contact region is coupled to a third voltage, and the second contact region is coupled to a fourth voltage, wherein the fourth voltage is set to be higher than the third voltage.

In accordance with the present invention, the first isolation portion having dopants of the second conductive type is formed between the substrate and the active region having dopants of the first conductive type, and the first isolation portion isolates the active region from the substrate. The second isolation portion having dopants of the first conductive type is formed between the substrate and the first isolation portion having dopants of the second conductive type, and it isolates the first isolation portion from the substrate. Therefore, the Schottky diode unit can be protected from current leakage so as to improve the integration density of semiconductor devices and the operation speed of the functional circuit.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
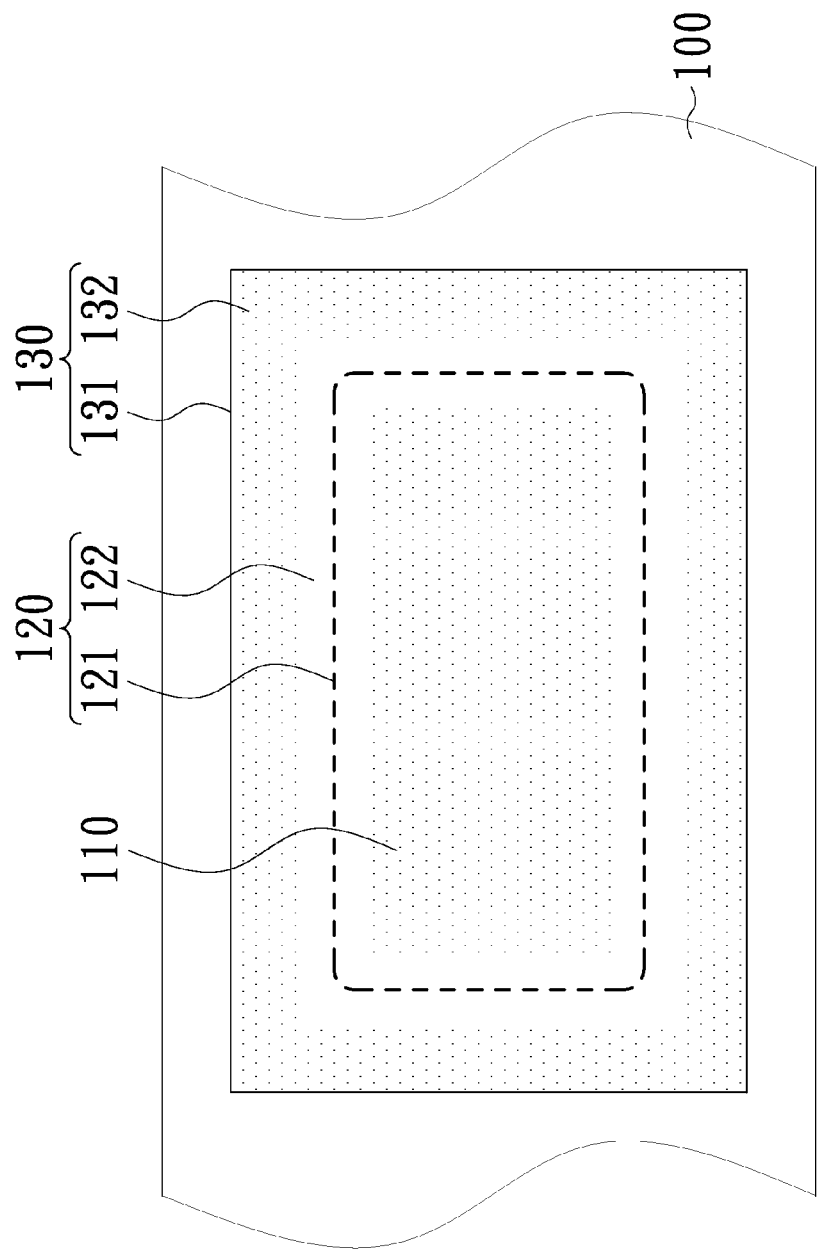
FIG. 1 is a schematic top view illustrating a Schottky diode having a current leakage protection structure according to an embodiment of the present invention.

Referring to FIG. 1, a Schottky diode unit 110 is defined in a substrate 100 according to an embodiment of the present invention. A first isolation portion 120 having dopants of a second conductive type is formed between the substrate 100 and the Schottky diode unit 110, and the first isolation portion 120 isolates the Schottky diode unit 110 from the substrate 100. The first isolation portion 120 includes a first well 121 and a first guard ring 122, wherein the first well 121 is disposed beneath the active region 112 (being marked as dash line shown in FIG. 1), and the first guard ring 122 surrounds the active region 112 and connects to the first well 121. A second isolation portion 130 having dopants of a first conductive type is formed between the substrate 100 and the first isolation portion 120, and the second isolation portion 130 isolates the first isolation portion 120. The second isolation portion 130 includes a second well 131 and a second guard ring 132, wherein the second well 131 is disposed beneath the first well 121, and the second guard ring 132 surrounds the first guard ring 122 and connects to the second well 131.

It is noted that the first guard ring 122 can be formed on the first well 121 or on both the first well 121 and the second well 131, i.e. a portion of the first guard ring 122 connecting to the first well 121 can be of the same level with or shallower than a bottom of the first guard ring 122 (marked as dash line shown in FIG. 1). The second guard ring 132 is formed on the second well 131, i.e. a portion of the second guard ring 132 connecting the second well 131 is at the same level with (marked as solid line shown in FIG. 1) a bottom of the second guard ring 132.

Figure 2:
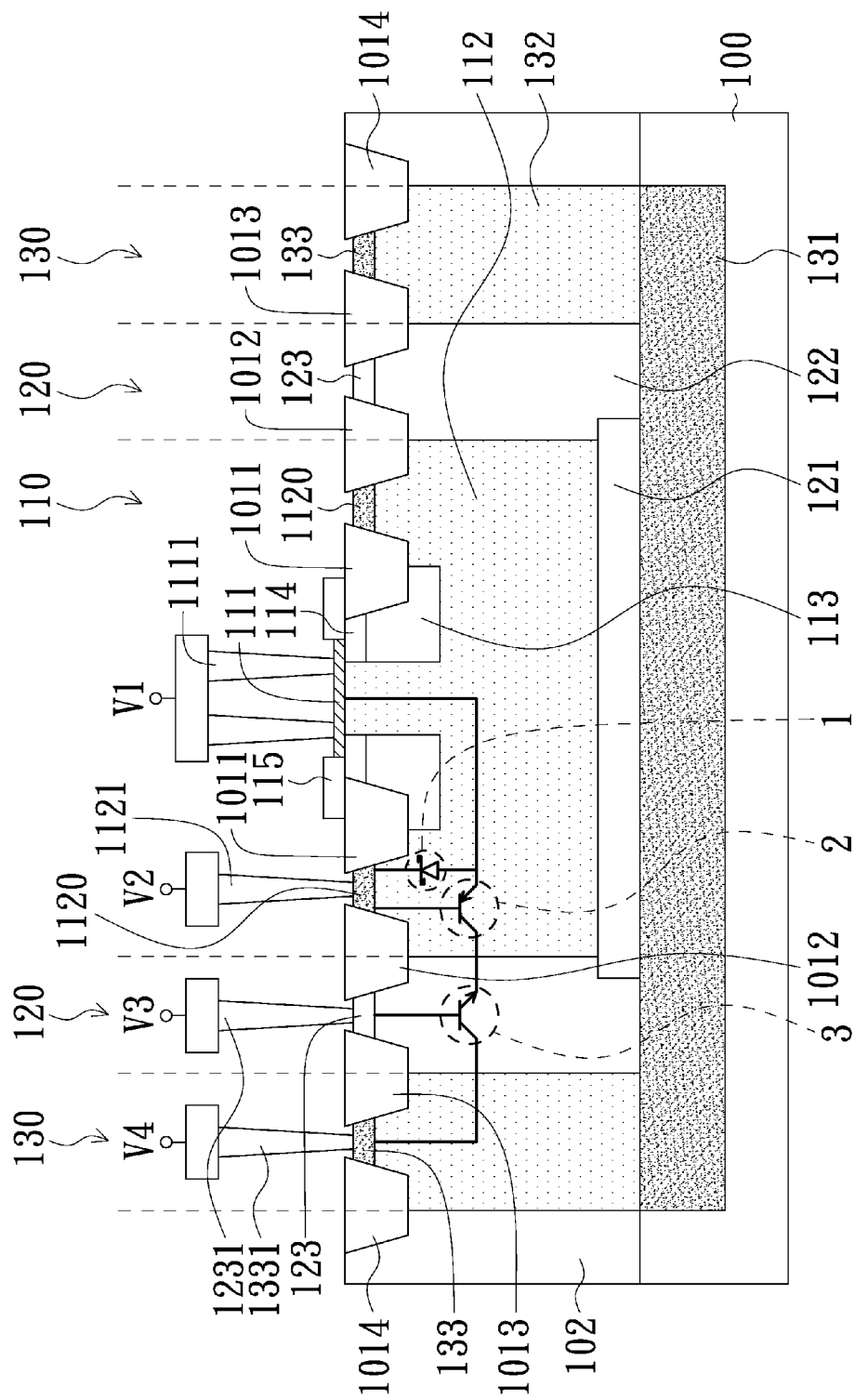
FIG. 2 is a schematic cross-sectional view illustrating the Schottky diode having a current leakage protection structure according to the embodiment of the present invention as shown in the Schottky diode of FIG. 1.

For sufficient description, FIG. 2 is a schematic cross-sectional view illustrating the Schottky diode unit 110 having a current protection structure according to the embodiment of the present invention.

As shown in FIG. 2, the substrate 100 is a silicon substrate, and the Schottky diode unit 110 is defined in the substrate 100. The Schottky diode unit 110 includes a metalized anode 111, an active region 112, a cathode 1120 and at least one isolation structure 1011, wherein the active region 112 has dopants of the first conductive type, the metalized anode 111 is formed on the active region 112, the cathode 1120 is formed atop the active region 112, and the isolation structure 1011 is formed between the metalized anode 111 and the cathode 1120. The metalized anode 111 and the active region 112 having dopants of the first conductive type can form a Schottky barrier (not shown), wherein a material for forming the metalized anode 111 can be metal or metal compound, e.g. Titanium (Ti), Titanium nitride (TiN) or Titanium silicide (TiSi), but not limited to. In this embodiment, the first conductive type is N-type, and the second conductive type is P-type. A concentration of N-type dopants in the cathode 1120, e.g. $10^{15}$ cm$^{-3}$, can be higher than a concentration of the N-type dopants in the active region 112, e.g. $10^{12}$ cm$^{-3}$. At least one contact plug 1111 formed on the metalized anode 111 and at least one contact plug 1121 formed on the cathode 1120 are used to be coupled a first voltage V1 and a second voltage V2 in a functional circuit, respectively.

In this embodiment, for adjusting a mobile path of the N-type dopants in the active region 112, a body region 113, an anode contact region 114 and a metal barrier layer 115 are respectively formed in the Schottky diode unit 110. In detail, the body region 113 having a concentration of P-type dopants is disposed beneath a portion of the metalized anode 111, the anode contact region 114 having a concentration of P-type dopants is disposed between the portion of the metalized anode 111 and the body region 113, and the metal barrier layer 115 is disposed on the isolation structure 1011 and surrounds the metalized anode 111. The concentration of the P-type dopants in the anode contact region 114, e.g. $10^{15}$ cm$^{-3}$, is greater than the concentration of the P-type dopants in the body region 113, e.g. $10^{13}$ cm$^{-3}$. Because both the P-type dopants in the body region 113 and the anode contact region 114 can form a depletion region (not shown) with the N-type dopants in the active region 112, so that the N-type dopants in the Schottky diode unit 110 under operating state run or travel toward to the metalized anode 111, i.e. through a mobile path of relatively low migration barrier in the active region 112. In addition, the step of forming the metalized anode 111 can be integrated with the process of fabricating a logic circuit by using a salicide as a material of the metalized anode 111. The metal barrier layer 115 is used for adjusting a region of the metalized anode 111 formed on the active region 112.

The first isolation portion 120 having P-type dopants includes a first well 121 and the first guard ring 122, wherein the first well 121 is disposed beneath the active region 112, and the first guard ring 122 surrounds the active region 112 and connects to the first well 121. In this embodiment, a first contact region 123 having P-type dopants and an additional isolation structure 1012 are optionally formed in the first guard ring 122, wherein the first contact region 123 is disposed atop the first guard ring 122, and the isolation structure 1012 is disposed between the first contact region 123 and the cathode 1120. A concentration of the P-type dopants in the first contact region 123, e.g. $10^{15}$ cm$^{-3}$, can be greater than the concentration of the P-type dopants in the first guard ring 122, e.g. $10^{13}$ cm$^{-3}$. At least a contact plug 1231 formed on the first contact region 123 is used to be coupled to a third voltage V3 in the functional circuit.

The second isolation portion 130 having N-type dopants includes a second well 131 and a second guard ring 132, wherein the second well 131 is disposed beneath the first well 121, and the second guard ring 132 surrounds the first guard ring 122 and connects to the second well 131. In this embodiment, the first guard ring 122 is formed on both the first well 121 and the second well 131. In this embodiment, a second contact region 133 having N-type dopants, a plurality of isolation structures 1013 and 1014 are optionally formed in the second guard ring 122, wherein the second contact region 133 is disposed atop the second guard ring 132, and the isolation structures 1013 and 1014 are respectively disposed between the first contact region 123, the second contact region 133 and a P-well 102 formed in the substrate 100. A concentration of the N-type dopants in the second contact region 133, e.g. $10^{15}$ cm$^{-3}$, can be greater than the concentration of the N-type dopants in the second guard ring 132, e.g. $10^{13}$ cm$^{-3}$. At least a contact plug 1331 formed on the second contact region 133 is used to be coupled to a fourth voltage V4 in the functional circuit.

The Schottky diode having the current leakage protection structure structure according to the present invention can effectively obviate a current leakage to flow into the substrate. For a brief and clear clarification on a current leakage protecting method of the Schottky diode having the isolation structure according to the present invention, please refer to FIG. 2 again.

As shown in FIG. 2, a Schottky diode path 1 (marked as a Schottky diode circuit symbol) is formed in the active region 112. The Schottky diode path 1 has the metalized anode 111 coupled to the first voltage V1 as P-polar electrode and the cathode 1120 coupled to the second voltage V2 as N-polar electrode. A parasitic PNP BJT path 2 (marked as a PNP BJT circuit symbol) is formed between the active region 112 and the first guard ring 122. The parasitic PNP BJT path 2 has the metalized anode 111 coupled to the first voltage V1 as an emitter electrode, the first contact region 123 coupled to the third voltage V3 as a collector electrode, and the cathode 1120 coupled to the second voltage V2 as a base electrode. A parasitic NPN BJT path 3 (marked as a NPN BJT circuit symbol) is formed between the active region 112, the first guard ring 122 and the second guard ring 132. The parasitic NPN BJT path 3 has the cathode 1120 coupled to the second voltage V2 as an emitter electrode, the second contact region 133 coupled to the fourth voltage V4 as a collector electrode, and the first contact region 123 coupled to the third voltage V3 as a base electrode.

Due to the Schottky diode being a "forward-bias operation" semiconductor device, the first voltage V1 coupling thereto is set to be equal to or high than the second voltage V2 coupling thereto during the operation of the Schottky diode path 1. Therefore, a forward bias is form between the metalized anode 111 and the cathode 1120. In the present invention, the fourth voltage V4 coupling thereto is set to be higher than the third voltage V3 coupling thereto, therefore a reverse bias is formed between the second contact region 133 and the first contact region 123, i.e. a reverse bias is formed between the collector electrode and the base electrode in the parasitic NPN BJT path 3. During the operation of the Schottky diode path 1, the third voltage V3 coupling thereto can be lower or higher than the second voltage V2 coupling thereto, therefore a reverse or forward bias can be selectively formed between the cathode 1120 and the first contact region 123.

In case of allowing the third voltage V3 coupling thereto to be lower than the second voltage V2 coupling thereto, a reverse bias is formed from the first contact region 123 to the cathode 1120. At a time of the first voltage V1 being higher than the second voltage V2 (i.e. the time of the Schottky diode path 1 conducting current), a forward bias is formed from the metalized anode 111 to the cathode 1120, a large portion of N-type current conducts from the cathode 1120 through the active region 112 to the metalized anode 111, and then the parasitic PNP BJT path 2 can be triggered to conduct a small portion of N-type current from the first contact region 123 through the active region 112 to the metalized anode 111, i.e. a leakage hole current formed by the Schottky diode unit 110 flows into the first contact region 123 but not into the substrate 100. In case of allowing the third voltage V3 coupling thereto to be higher than the second voltage V2 coupling thereto but lower than the first voltage V1 coupling thereto, a forward bias is formed from the first contact region 123 to the cathode 1120. At the time of the Schottky diode path 1 conducting current, the parasitic NPN BJT path 3 can be triggered to conduct a small portion of N-type current from the cathode 1120 through the active region 112 to the first contact region 123 and the second contact region 133, i.e. a leakage electron current formed by the Schottky diode unit 110 flows into the first contact region 123 and second contact region 133, but not into the substrate 100. According to the above clarification, the third voltage V3 coupling to the first contact region 123 can be set as an independent ground in the Schottky diode unit 110 having a current leakage protection structure, and it need not to be consisted of a common ground in a functional circuit formed in the substrate. Therefore, a specific voltage of the third voltage V3 coupling thereto can meet a demand of the functional circuit which has the Schottky diode unit 110 having a current leakage protection structure formed, e.g. increasing a reverse voltage of the Schottky diode unit 110 so as to increase an operating voltage thereof, i.e. the first voltage V1 coupling to the metalized anode 111 can be increased.

From the above descriptions, the present invention provides a Schottky diode having a current leakage protection structure and a current leakage protecting method of the Schottky diode according to the present invention can effectively prevent the current leakage of the Schottky diode. It is noted that a horizontal cross-sectional area of forming a current protection structure according to the present invention is less than 1/10 of a horizontal cross-sectional area of the active region of a conventional Schottky diode, therefore, the Schottky diode having the current protection structure for use in a functional circuit can improve the integration density of semiconductor devices and the operation speed of the functional circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Schottky diode having a current leakage protection structure, comprising:
   a Schottky diode unit, defined in a substrate and comprising:
      an active region, having dopants of a first conductive type;
      a metalized anode, formed on the active region;
      a cathode, formed atop the active region; and
      at least one isolation structure, formed between the metalized anode and the cathode;
   a first isolation portion, having dopants of a second conductive type, formed between the substrate and the active region, and comprising:
      a first well, disposed beneath the active region; and
      a first guard ring, surrounding the active region and connecting to the first well; and
   a second isolation portion, having dopants of the first conductive type, formed between the substrate and the first isolation portion, and comprising:
      a second well, disposed beneath the first well; and
      a second guard ring, surrounding the first guard ring and connecting to the second well.

2. The Schottky diode according to claim 1, wherein the first conductive type is N-type, and the second conductive type is P-type.

3. The Schottky diode according to claim 1, wherein a concentration of dopants of the second conductive type in the first isolation portion is greater than a concentration of dopants of the first conductive type in the active region.

4. The Schottky diode according to claim 1, wherein the metalized anode is formed of a salicide.

5. The Schottky diode according to claim 1, wherein a concentration of dopants of the first conductive type in the cathode is greater than a concentration of dopants of the first conductive type in the active region.

6. The Schottky diode according to claim 5, wherein the cathode is isolated from the first isolation portion with an additional isolation structure.

7. The Schottky diode according to claim 1, further comprising a body region, an anode contact region and a metal barrier layer, wherein the body region is formed beneath the metalized anode, the anode contact region is formed between the metalized anode and the body region, and the metal barrier layer is formed on the isolation structure and surrounds the metalized anode.

8. The Schottky diode according to claim 7, wherein the body region and the anode contact region both have dopants of the second conductive type, and a concentration of dopants of the second conductive type in the anode contact region is greater than a concentration of dopants of the second conductive type in the body region.

9. The Schottky diode according to claim 1, further comprising a first contact region formed atop the first guard ring and a second contact region formed atop the second guard ring, wherein the first contact region and the second contact region are isolated from each other with an additional isolation structure.

10. A current leakage protecting method of the Schottky diode according to claim 9, comprising:
    coupling the metalized anode to a first voltage, and coupling the cathode to a second voltage, wherein the first voltage is set to be equal to or higher than the second voltage; and coupling the first contact region to a third voltage, and coupling the second contact region to a fourth voltage, wherein the fourth voltage is set to be higher than the third voltage.

11. The current leakage protecting method according to claim 10, further comprising setting the third voltage as an independent ground.

12. The Schottky diode according to claim 9, wherein a concentration of dopants of the second conductive type in the first contact region is greater than a concentration of dopants of the second conductive type in the first guard ring, and a concentration of dopants of the first conductive type in the second contact region is greater than a concentration of dopants of the first conductive type in the second guard ring.

13. The current leakage protecting method according to claim 12, wherein a forward bias is formed between the metalized anode and the cathode as the first voltage is set to be higher than the second voltage so as to have a large portion of the first conductive type current conducting from the cathode through the active region to the metalized anode.

14. The current leakage protecting method according to claim 13, further comprising setting the third voltage to be higher than the second voltage so as to form a forward bias from the first contact region to the cathode, thereby having a small portion of the first conductive type current conducting from the cathode through the active region to the first contact region and the second contact region.

15. The current leakage protecting method according to claim 13, further comprising setting the third voltage to be lower than the second voltage so as to form a reverse bias from the first contact region to the cathode, thereby having a small portion of the first conductive type current conducting from the first contact region through the active region to the metalized anode.

* * * * *

UNITED STATES PATENT AND TRADEMARK OFFICE
CERTIFICATE OF CORRECTION

PATENT NO.        : 8,786,362 B1  
APPLICATION NO.   : 13/909097  
DATED             : July 22, 2014  
INVENTOR(S)       : Lin et al.

Page 1 of 1

It is certified that error appears in the above-identified patent and that said Letters Patent is hereby corrected as shown below:

Item (72) in the sixth inventor name listed under Inventor(s) on the title page of the Patent identified as "Wen-Chun Chang" should be changed to "Wei-Chun Chang".

Signed and Sealed this  
Third Day of February, 2015

Michelle K. Lee  
*Deputy Director of the United States Patent and Trademark Office*